(12) United States Patent
Gasperi (10) Patent No.: US 7,164,275 B2
(45) Date of Patent: Jan. 16, 2007

(54) AC POWER LINE IMPEDANCE MONITORING METHOD AND SYSTEM

(75) Inventor: Michael Lee Gasperi, Racine, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 78 days.

(21) Appl. No.: 10/955,407

(22) Filed: Sep. 30, 2004

(65) Prior Publication Data
US 2006/0066321 A1   Mar. 30, 2006

(51) Int. Cl.
*G01R 27/28*    (2006.01)
*G01R 27/08*    (2006.01)

(52) U.S. Cl. ........................ 324/652; 324/691
(58) Field of Classification Search ............... None
See application file for complete search history.

(56) References Cited

U.S. PATENT DOCUMENTS

| | | | | |
|---|---|---|---|---|
| 3,904,859 | A * | 9/1975 | Poncelet | 702/65 |
| 4,001,646 | A * | 1/1977 | Howell | 361/45 |
| 4,150,411 | A * | 4/1979 | Howell | 361/45 |
| 5,587,662 | A | 12/1996 | Kelley et al. | 324/713 |
| 5,631,569 | A | 5/1997 | Moore et al. | 324/713 |
| 6,397,156 | B1 * | 5/2002 | Bachmann et al. | 702/65 |
| 6,407,893 | B1 * | 6/2002 | Neiger et al. | 361/42 |
| 6,515,485 | B1 | 2/2003 | Bullock et al. | 324/601 |
| 6,713,998 | B1 * | 3/2004 | Stanimirov et al. | 324/117 R |
| 6,801,044 | B1 * | 10/2004 | Kesil et al. | 324/663 |

FOREIGN PATENT DOCUMENTS

| | | |
|---|---|---|
| DE | 1237218 B | 3/1967 |
| DE | 1257960 B | 1/1968 |
| DE | 3600770 | 11/1986 |
| DE | 19504271 | 2/1996 |
| FR | 2498762 A | 7/1982 |

OTHER PUBLICATIONS

Operator's Manual ZM-100 Mains Impedance Meter; Precision Control Systems; Sold and Marketed by PowerLines; 41 pages.
Z-Brick features and specifications; Z-Brick, the newly introduced line-to-line impedance test otion for the EPA 2000; http://www.rxms.com/zbrick.htm; 2 pages.

(Continued)

*Primary Examiner*—Andrew H. Hirshfeld
*Assistant Examiner*—John Teresinski
(74) *Attorney, Agent, or Firm*—Patrick S. Yoder; Alexander M. Gerasimow (57) ABSTRACT

A technique for determining inductive and resistive components of power line impedance. A measurement circuit switches a burden or drain resistor between power line conductors to cause a droop or sag in a voltage waveform. The voltage waveform is sampled prior to inclusion of the resistor in the circuit, as well as after to identify the droop. The short circuit between the power lines is then removed by opening the circuit and a capacitor in the test circuitry causes a resonant ring due to the inductive component of the power line impedance. Based upon the period or frequency of the resonant ring, and upon the voltage measurements with and without the resistor in the circuit, the inductive and resistive components of power line impedance can be computed.

34 Claims, 5 Drawing Sheets

OTHER PUBLICATIONS

Stephen B. Dubina, Jr. and Thomas D. Barkand; AC System Impedance Testing; Mine Safety and Health Administration Mine Electrical Systems Division; 8 pages.

SureTest Circuit Analyzer and SureTest w/AFCI Instructions; #61-154, #61-155, Ideal Industries, Inc.; 10 pages.

Adly A. Girgis and R. Brent McManis; Frequency Domain Techniques for Modeling Distribution or Transmission Networks Using Capacitor Switching Induced Transients, IEEE Transactions on Power Delivery, vol. 4, No. 3, Jul. 1989; 9 pages.

Keiju Matsui, Nobuyuki Ishigure, and Fukashi Ueda; On-line Impedance Meter to Measure the Impedance of a Distribution Line Using Inverter, IECON'01: The 27th Annual Conference of the IEEE Industrial Electronics Society; 2001: 7 pages.

* cited by examiner

AC POWER LINE IMPEDANCE MONITORING METHOD AND SYSTEM

BACKGROUND

The present invention relates generally to the field of monitors and measurement devices for electrical power. More particularly, the invention relates to techniques for determining impedance parameters of electrical power, particularly power distributed via a power distribution grid.

A wide range of applications exists for power monitors and devices capable of determining parameters of electrical power. For example, in many application unwanted conditions can arise in loads, distribution equipment and lines, the severity of which is a function of the line impedance. For example, the line impedance is a precursor to calculating short circuit current, arc current, available energy, and other important features of electrical power. Because these currents and energies can flow or be released during a fault condition or other unwanted, or even desired situations, knowing the power line impedance is of considerable importance.

Various methods exist in the art for calculating or attempting to determine power line impedance. For example, impedance can be computed based upon nameplate information on certain equipment, in addition to knowledge of the physical and electrical characteristics of distribution components. Transformers, for example, typically carry nameplate information regarding impedance as a percentage value. Knowledge of the size and length of electrical conductors, and the characteristics of other intermediate components between the transformer and a load can be used to calculate or estimate the impedance at particular points in a system. However, such techniques are highly imprecise, and rely upon some degree of estimation as to the actual characteristics of the components and transmission lines.

Techniques have also been developed for directly measuring impedance of power lines. Such techniques have permitted some degree of knowledge of the power line impedance, but are still somewhat imprecise or incomplete. For example, known techniques do not typically permit measurement of both inductive and resistive components of the power line impedance. While one of these components may generally dominate the impedance measurement, both components are important for determining the actual characteristics of the current and energy that can be released by the power line, particularly during transient periods such as faults.

There is a need in the art for improved techniques for measuring and determining impedance of power sources. There is a particular need for a technique that would permit accurate measurement of power line impedance, including both resistive and inductive components thereof.

BRIEF DESCRIPTION

The present invention provides novel techniques for determining power line impedance values designed to respond to such needs. The technique can be used in a wide range of settings, such as in available energy determinations, identification of short circuit currents and arc currents, for identifying possible problems with under-loading of power lines and so forth. The techniques can be used on single-phase and three-phase applications with little modification. Moreover, the technique can be implemented in permanent (i.e., hard-wired) circuitry, or can be part of mobile or even hand-held devices used to identify impedance only on a periodic or sporadic basis. Still further, the technique may be implemented through the use of analog circuitry or digital circuitry, such as by sampling the desired input data and subsequent processing to identify the desired impedance parameters.

In accordance with certain aspects of the present techniques, a burden or drain in placed on a power line, the impedance of which is to be measured. The drain causes a droop in the voltage waveform through the power line that can be measured. Following this droop, the drain or burden is removed from the circuit and a capacitor causes, in conjunction with the inductive component of the power line impedance, a resonant ring. The period or the frequency of the ring can be identified, and used to determine the inductive component of the power line impedance. Further, the resistive component can be identified from the voltage droop, and other parameters of the circuitry. The resulting determinations can then be used for subsequent processing or estimations, such as available energy, short circuit current, arc current, and so forth.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
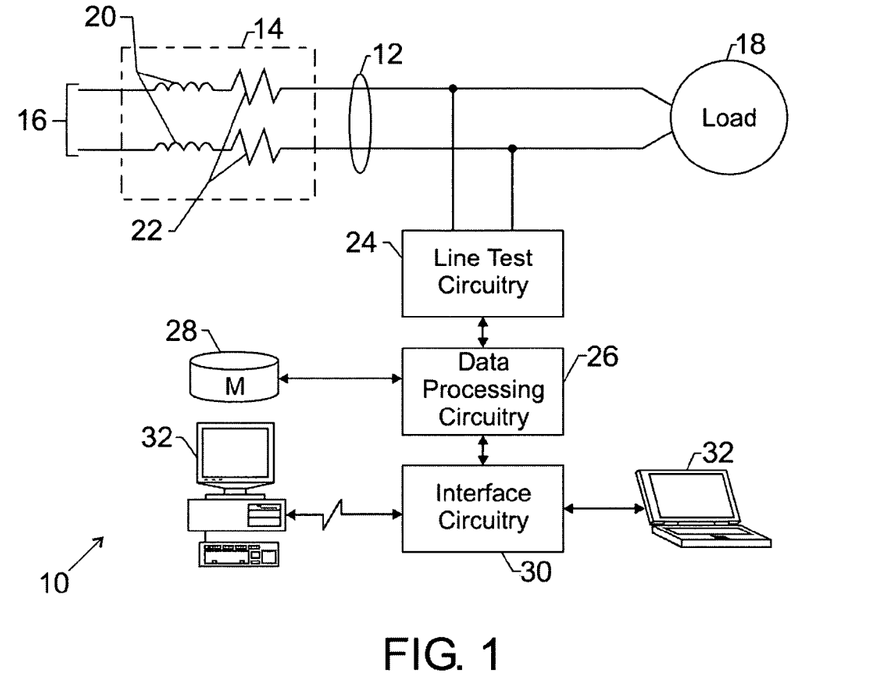
FIG. 1 is a diagrammatical representation of a power line impedance measurement system in accordance with aspects of the present technique, applied to a single-phase application.

Turning now to the drawings, and referring first to FIG. 1, an impedance monitoring system is illustrated and designated generally by the reference numeral 10. The impedance monitoring system is illustrated in a single-phase application. That is, the system is illustrated for identifying the impedance of a single-phase power source. As will be appreciated by those skilled in the art, and as discussed in greater detail below, the system may be easily adapted for identifying impedance parameters of three-phase power lines and sources as well.

Impedance monitoring system 10 is illustrated as coupled to a pair of power supply lines 12. Power supply lines 12, and any upstream circuitry, such as transformers, connectors, and so forth are considered to have a net impedance illustrated by equivalent circuitry in box 14 of FIG. 1. The impedance 14 is, for the present purposes, considered to be a collective or cumulative impedance of the entire power supply network, represented generally by reference numeral 16 to a point between a power supply grid and a load 18. As discussed in greater detail below, the present system provides the potential for determining impedance by measurement at or adjacent to a load 18. In practical applications, the monitoring system 10 may be coupled at any point along the power supply lines.

Impedance 14 is generally considered to include inductive components 20 and resistor components 22. The inductive and resistive components will be present in both supply lines, although for the present purposes these components may be grouped or accumulated into a net inductive component and a net resistive component as discussed in greater detail below.

System 10 includes line test circuitry 24 for perturbing the voltage waveform transmitted through the power lines and for making measurements of the voltage waveform. The line test circuitry 24 is coupled to and works in conjunction with data processing circuitry 26. As discussed in greater detail below, the line test circuitry 24 and the data processing circuitry 26 may, in certain applications, be analog circuitry, or at least partially comprise analog circuitry. In a present embodiment, however, the line test circuitry and the data processing circuitry digitally sample voltage measurements and store the sampled data in a memory 28. The stored sampled voltage measurements are then analyzed to determine parameters of the voltage waveform that are used to compute the values of inductive and resistive components of the line impedance. As will be apparent to those skilled in the art, the data processing circuitry 26 and memory 28 may be any suitable form. For example, both of these components may be included in a general purpose or application-specific computer. Moreover, the circuitry may be local and permanently installed with an application, or may be portable circuitry, such as in hand-held devices. Similarly, the data processing circuitry and memory may be entirely remote from the line test circuitry so as to provide the desired analysis without necessarily displacing equipment or operators to the test site.

The data processing circuitry 26 may be accessed and interfaced with operator workstations by interface circuitry 30. The interface circuitry 30 may include any suitable interfaces, such as Ethernet cards and interfaces, Internet access hardware and software, or other network interfaces. In appropriate situations, the interface circuitry 30 may allow for interfacing with the data processing circuitry by conventional serial port communication, and so forth. As illustrated in FIG. 1, various operator interfaces may be envisioned, including laptop computers, computer workstations, and so forth, as represented generally by reference numeral 32 in FIG. 1.

Figure 2:
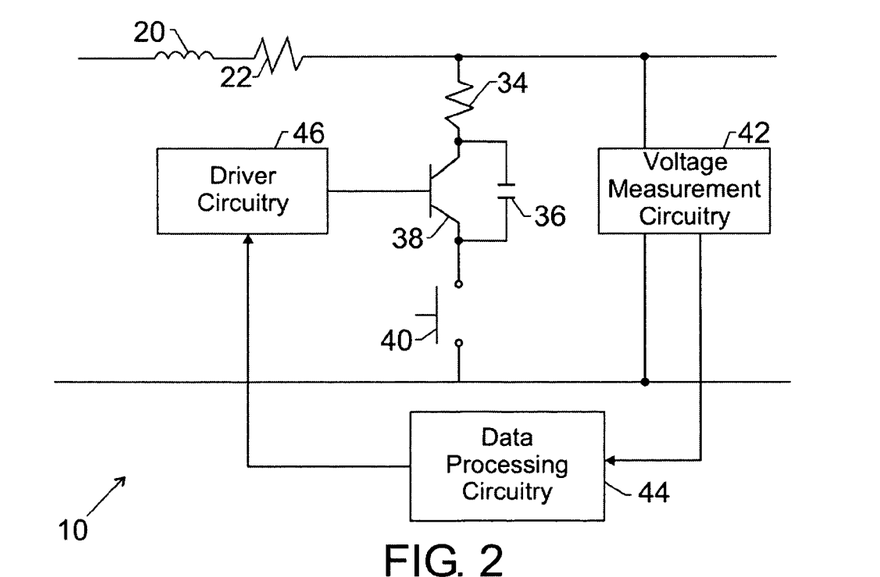
FIG. 2 is a somewhat more detailed view of certain of the circuitry of the power line impedance measurement system of FIG. 1.

The line test circuitry 24 is illustrated in somewhat greater detail in FIG. 2, along with the physical relationship between the portions of the circuitry. As noted above, the collective or cumulative impedance in the power lines may be diagrammatically represented as a single inductive component 20 and a resistive component 22. The line test circuitry includes a resistor 34 which is coupled in series with a capacitor 36. A solid state switch 38 is coupled in parallel with the capacitor 36 so as to permit the capacitor 36 to be bypassed by creating a short circuit between the power lines during a test sequence as summarized below. Where desired, an enable switch, represented generally at reference numeral 40, may be provided in series with these components. A switch 40 may permit an operator to enable a test sequence, while removing the components from the power line circuit during normal operation. Thus, switch 40 may permit any leakage current between the power lines to be avoided.

Voltage measurement circuitry 42 is provided that spans the power line conductors. The voltage measurement circuitry 42 may include any suitable voltage measurement configurations, and is particularly adapted to sample voltage across the power lines and to provide values representative of the sampled voltage to data processing circuitry 44. The data processing circuitry 44 includes the data processing circuitry 26 and the memory 28 illustrated in FIG. 1, along with any appropriate programming for carrying out the functions, measurements, and analyses described below. To initiate and advance the test sequences for measuring the parameters of the power line impedance, the data processing circuitry 44 is coupled to driver circuitry 46 which provides signals to solid switch state 38 to open and close the switch as described in greater detail below.

Although the present invention is not intended to be limited to any particular circuit configuration or component values, the following component values have been found effective in identifying impedance parameters in a 60 Hz power source. Resistor 34 was implemented as a 1 Ω resistor, while the value of capacitor 36 was 22 µF. The switch 38 was selected as an insulated gate bipolar transistor (IGBT) having a voltage rating of 1200V and amperage rating of 400A. It is advisable that the switch 38 be overrated to some degree to permit peaks in the voltage waveform that may result from opening and closing of the switch, and particularly the affects of the resonant ring following closure.

Figure 3:
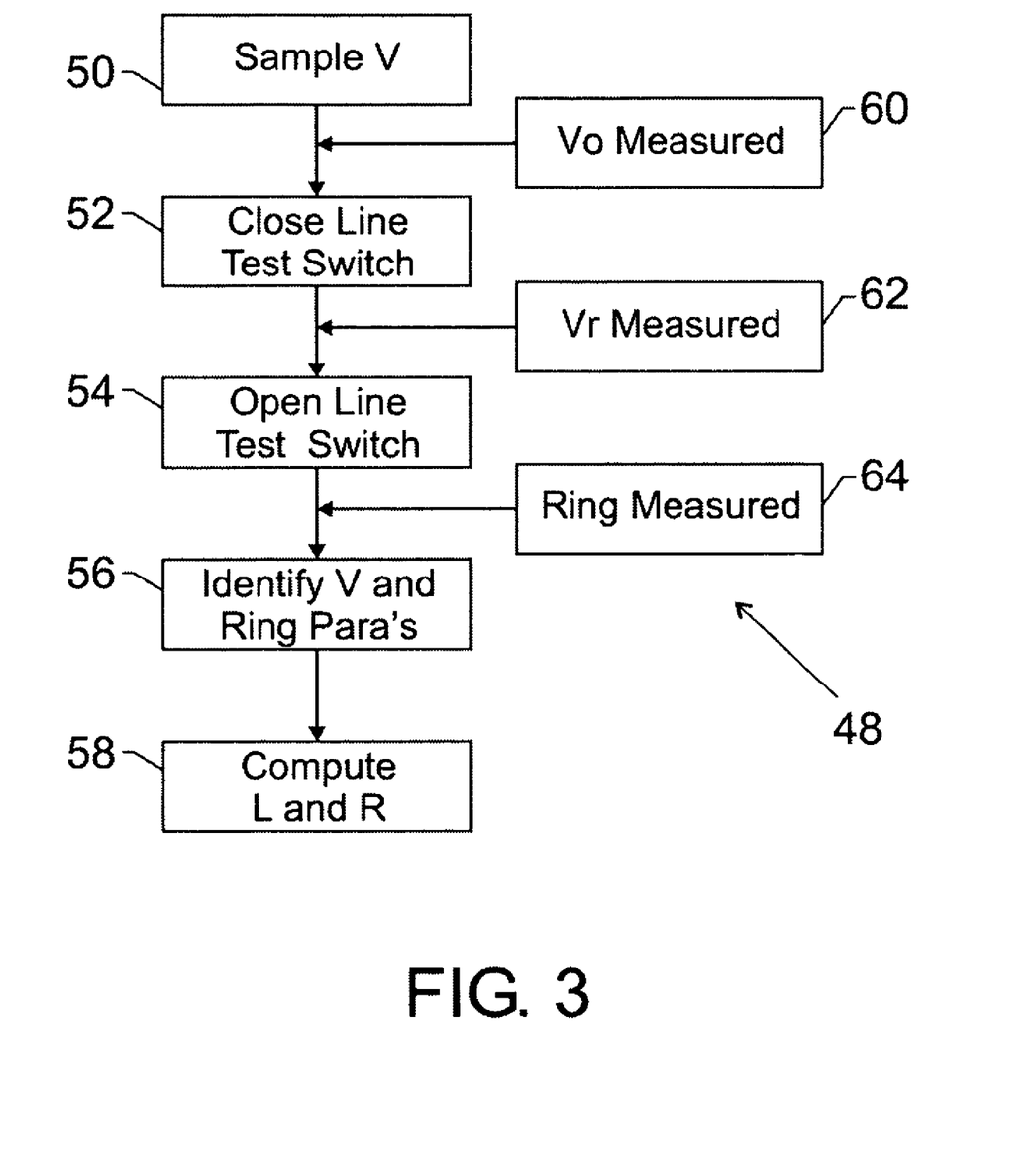
FIG. 3 is a diagrammatical representation of certain exemplary steps in identifying power line impedance values based upon the circuitry of FIGS. 1 and 2.

Exemplary logic 48 for a particular test sequence implemented by the circuitry of FIG. 2 is illustrated diagrammatically in FIG. 3. As noted above, voltage test circuitry 42 first begins to sample voltage across the power lines as indicated at reference numeral 50. At a desired point in the waveform, the switch 38 is closed, as indicated at step 52 in FIG. 3. Closure of switch 38 (with switch 40 closed to enable the circuitry, where such a switch is provided) causes a short circuit between the power lines, by routing current around capacitor 36. The low value of the resistor 34 acts as a drain or burden, causing a droop in the voltage waveform peak as described in greater detail below. Subsequently, switch 38 is opened, as indicated at reference numeral 54. Opening of the switch then causes a resonant ring between the inductive component 20 of the line impedance and the capacitor 36. This resonant ring is dampened by the resistive component 22 of the power line impedance and by the resistor 34.

With the voltage continuously being measured (i.e., sampled) by the voltage measurement circuitry 42, measurements are stored in the memory circuitry for later analysis. In a present implementation, with digital sampling of the voltage waveform, at step 56 in FIG. 3, the voltage and ring parameters used to identify the inductive and resistive components of the line impedance are then determined. At step 58 the inductive and resistive components of the line impedance are then computed based upon these identified values.

Thus, with steps 50 through 58 being carried out, the system response is measured continuously through the sampled data. These measurements are summarized at step 60 in FIG. 3, where a value of the voltage with the line test circuitry open is measured, and step 62 where a voltage across the power lines with the resistor 34 in short circuit between the power lines is measured. Step 64 represents measurement of the ring parameters used in the subsequent computations.

The calculations made of the inductive and resistive components of the power line impedance in accordance with the present techniques may be based upon the following computational scheme. As will be appreciated by those skilled in the art, the inductive-capacitive (LC) resonant frequency established upon opening of switch 38, with little or no damping in the circuit may be expressed by the relationship:

$$2\pi f = \frac{1}{\sqrt{L \, Cload}} \qquad \text{Equation 1}$$

where f is the resonant frequency of the LC circuit, L is the value of the inductive component of the line impedance, and the parameter Cload is the value of the capacitor 36 discussed above.

It will be noted, however, the resistor 34, particularly where a very low value of resistance is chosen, will provide significant damping to the resonant ring. Indeed, as will be appreciated by those skilled in the art, the value of the resistor 34 chosen strikes a balance between the desire to adequately sample a voltage droop caused by the drain represented by the resistor, while providing a significantly long (i.e., less damped) resonant ring to permit measurement of the ring period or frequency. Considering such damping, the relationship indicated in Equation 1 becomes described by the following relationship:

$$2\pi f = \sqrt{\frac{1}{L \, Cload} - \left(\frac{R + Rload}{2L}\right)^2} \qquad \text{Equation 2}$$

where the value R represents the value of the resistive component of the line impedance, and the value Rload represents the rating of the resistor 34 discussed above.

Based upon equation 2, and solving for the value of the line inductance L, the following relationship may be expressed in terms only of the values of Cload, Rload and the frequency f:

$$L = \frac{\frac{1}{Cload} + \sqrt{\frac{1}{Cload^2} - (2\pi f)^2 Rload^2}}{2(2\pi f)^2} \qquad \text{Equation 3}$$

To complete the system of equations desired for calculating the inductive and resistive components of the line impedance, in accordance with the present techniques, the voltage sag or droop caused by closure of switch 38 and the presence of the drain or burden resistor 34 may be expressed in terms of the voltage sampled across the power lines with the line test circuitry open, indicated by the quantity Vo, and the voltage across the power lines with the circuitry closed, Vr, that is, with the resistor 34 in a series across the power lines as follows:

$$Vr = Vo \frac{Rload}{j377L + R + Rload} \qquad \text{Equation 4}$$

where Vo and Vr are either the peak or RMS ac voltage values. It should be noted that the value 377 in Equation 4 (and in the subsequent equations below) is derived from the product of $2\pi$ and a line frequency of 60 Hz. As will be appreciated by those skilled in the art, the equations will differ for other line frequencies, although the principles for computation of the line impedance parameters will remain unchanged. Equation 4 may be rewritten as follows:

$$Vr = Vo \frac{Rload}{\sqrt{(377L)^2 + (R + Rload)^2}} \qquad \text{Equation 5}$$

It may be noted that Equation 5 may be solved in terms of the value of the resistive component of the line impedance, R, as follows:

$$R = \sqrt{\frac{(VoRload)^2 - (Vr377L)^2}{Vr^2}} - Rload \qquad \text{Equation 6}$$

Thus, based upon three measured values alone, the values of the inductive component of the line impedance, L, and the resistive component of the power line impedance, R, may be computed by Equations 3 and 6. The measured values, in accordance with the present technique, are the values of Vo, Vr, and the frequency f, or the period, which will be appreciated by those skilled in the art, is the inverse of this frequency value.

Figure 4:
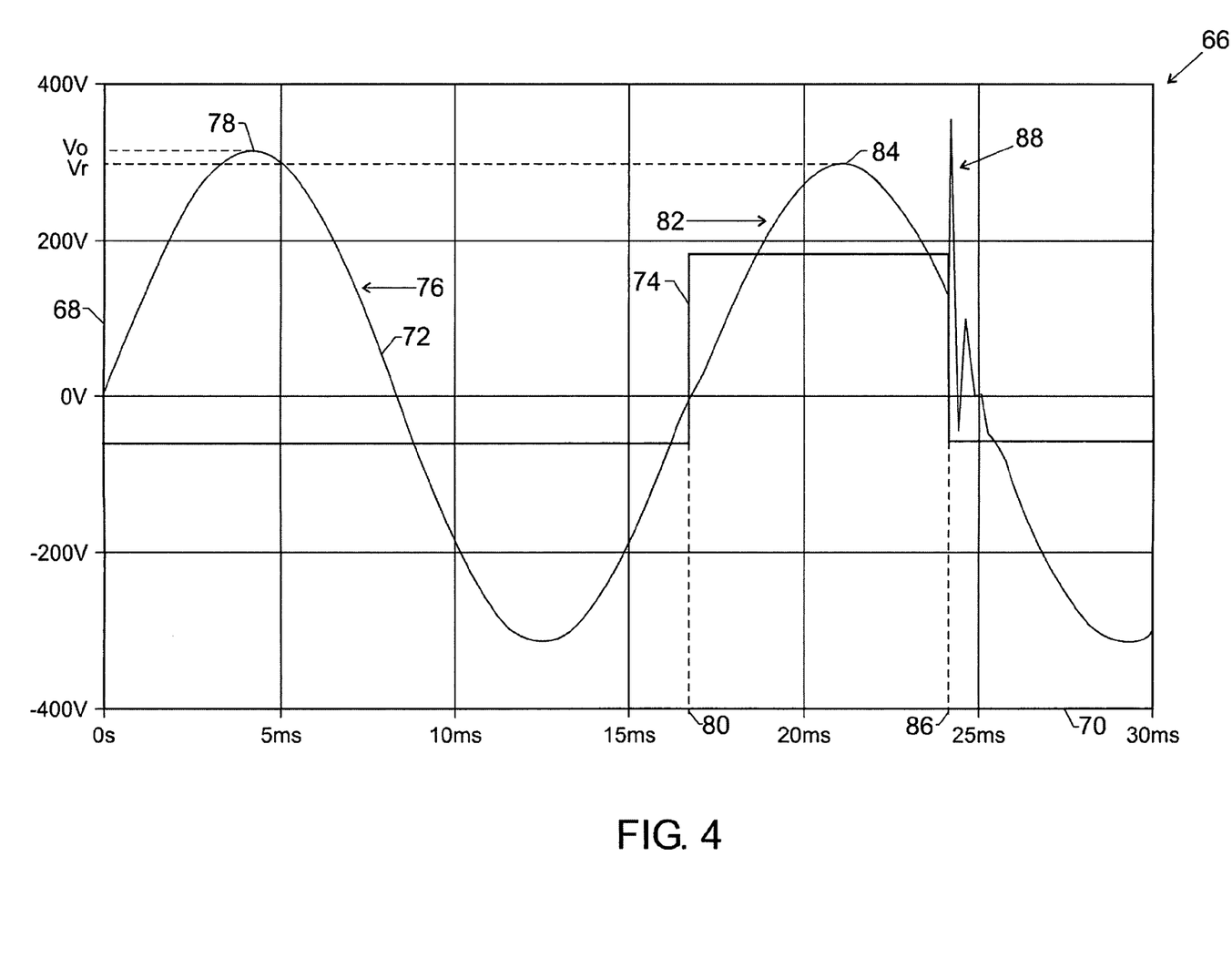
FIG. 4 is a voltage waveform and switching waveform for a solid state switch of the circuitry illustrated in FIG. 2 for causing a voltage droop and a resonant ring used to identify impedance parameters.

FIG. 4 illustrates an exemplary ac voltage waveform and a switching waveform for the switch 38 during an exemplary test sequence in accordance with FIG. 3 to measure values for use in calculating the impedance parameters in accordance with Equations 3 and 6 discussed above. FIG. 4 illustrates the waveforms graphically as indicated generally by reference numeral 56. The voltage waveform is illustrated graphically with respect to voltage, as indicated axis 68 over time, as indicated by axis 70. The voltage trace 72 of the waveform takes the form of a sine wave. Trace 74 represents the state of switch 38 or, more particularly, the signal applied to drive the gate of the switch to change its conductive state during the testing procedure.

As can be seen from FIG. 4, once sampling of the waveform has begun, samples will be taken continuously at a desired frequency, above the Nyquist rate, to provide reliable data for analysis. In a first cycle 76 of the waveform, with the test circuit open, a peak voltage 78, corresponding to Vo will be detected, among the other values detected and stored. At some point during or preceding a second cycle 82, switch 38 is placed in a conductive state to complete the current carrying path between the line conductors. The change in state of the switch is indicated at the rising edge 74 of the waveform, and occurs at time 80. As a result of the significant voltage drain caused by resistor 34, a sag or droop is detected in the peak 84 of the voltage waveform, with the peak generally corresponding to the value Vr. Subsequently, the switch 38 is opened, as indicated by the drop in waveform 74 that occurs at time 86 indicated in FIG. 4. The opening of switch 38 causes a resonant ring as indicated generally at reference numeral 88. As noted above, the resonant ring may have a peak voltage above the peak voltage of the sinusoidal waveform, and the switch 38 may be selected to accommodate such peaks.

Figure 5:
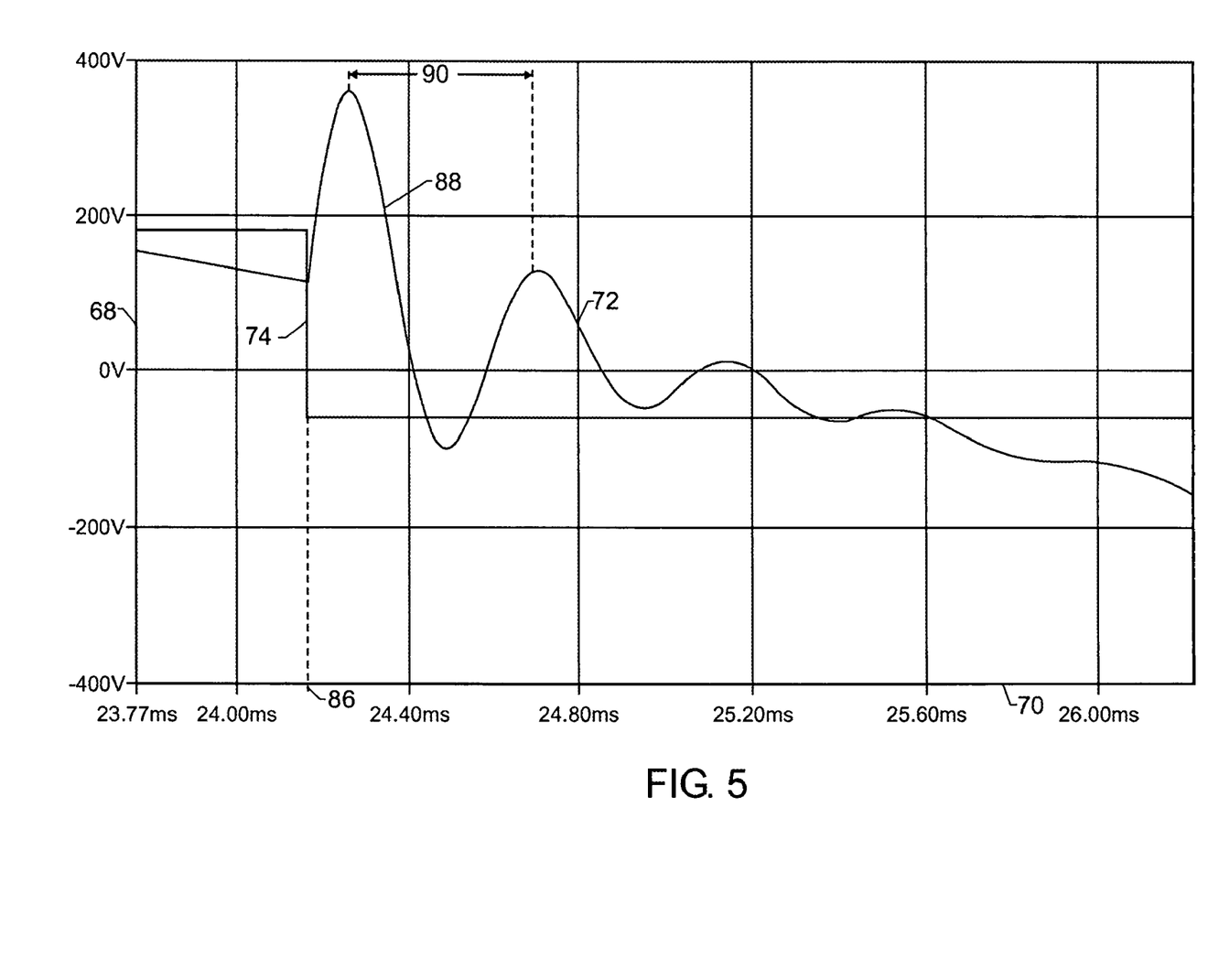
FIG. 5 is a detailed view of an exemplary resonant ring caused in a voltage waveform and used for determine certain of the impedance parameters in accordance with aspects of the present technique.

FIG. 5 illustrates a more detailed view of the resonant ring occurring from opening of the switch of the line test circuitry. Again graphed with respect to a voltage axis 68 and a time axis 70, the ring occurs as the voltage across the lines is decreasing, as indicated by the initial slope of trace 72. The falling edge of waveform 74 represents the removal of the drive signal to the switch causing opening of the circuit. The resulting resonant ring 88 will have a period, or consequently a frequency, that is a function of the circuit component parameters and of the inductive component of the line impedance. Because the voltage waveform is continuously sampled, the frequency or period may be measured, with a full period being indicated by reference numeral 90 in FIG. 5. As will be apparent to those skilled in the art, the period may be measured in a number of ways, as may the frequency. For example, a half cycle alone may be used to determine the frequency or period, or a full or even more than one cycle may be used. Similarly, in a present embodiment, the values of the ring as sampled by the circuitry may be compared or processed with the naturally declining value of the sinusoidal waveform to provide an accurate indication of the period of the resonant ring. Based upon the measured voltages, Vo, Vr and either the period of the resonant ring or its frequency, then, Equations 3 and 6 may be employed or determining the values of L and R.

Figure 6:
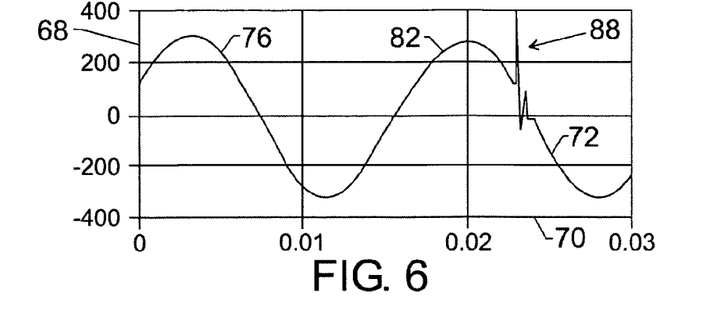
FIG. 6 is graphical representation of a voltage waveform similar to that of FIG. 4, before exemplary filtering of sampled data.
Figure 7:
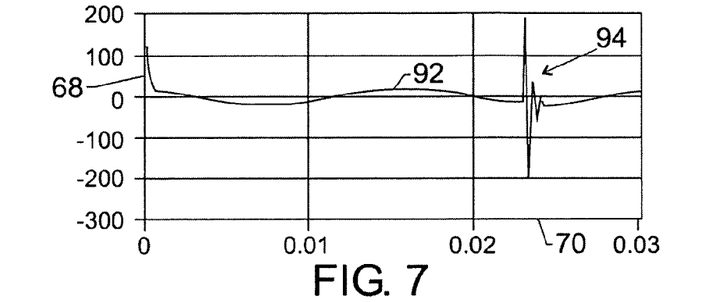
FIG. 7 is a graphical representation of the waveform of FIG. 6 following high pass filtering of sampled data to flatten a portion of the waveform around a resonant ring.
Figure 8:
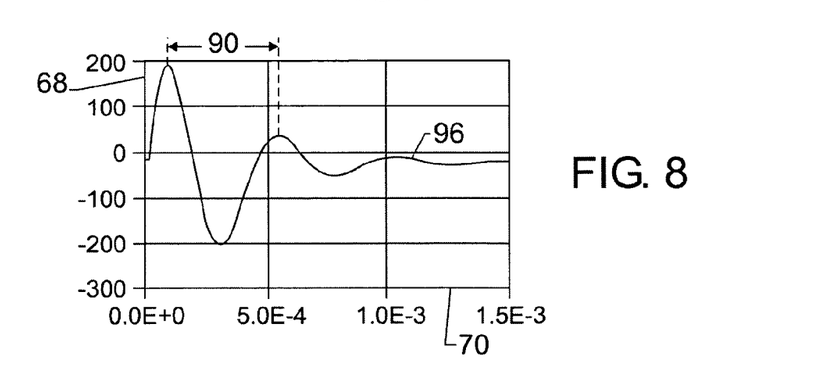
FIG. 8 is a more detailed illustration of the resonant ring visible in FIG. 7 from which measurements can be made for computing impedance parameters.
Figure 9:
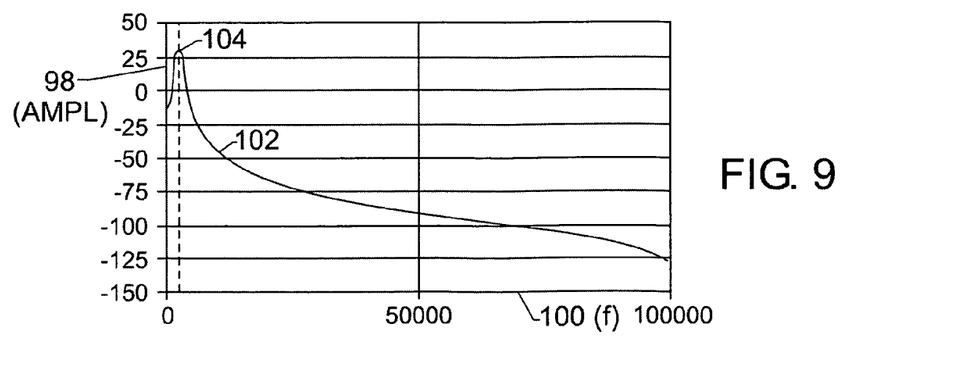
FIG. 9 is a graphical representation of an exemplary frequency domain plot of the ring illustrated in FIG. 8.

An alternative approach to identifying the parameters discussed above is illustrated in FIGS. 6–9. As illustrated in FIG. 6, the voltage waveform that is sampled by the voltage measurement circuitry may be illustrated as having successive cycles 76 and 82, with a voltage droop or sag occurring in cycle 82 due to the resistor 34 discussed above. The subsequent ring upon a removal of the short circuit across the power lines is again indicated at reference numeral 88. The data may be high-pass filtered to generally flatten the waveform as indicated at reference numeral 92 in FIG. 7. The high-pass filtered waveform will then exhibit the ring which may be timed to occur during a generally linear portion of the sine wave, as indicated at reference numeral 94 in FIG. 7. From the data, the ring 94 may be extracted as indicated generally in FIG. 8. The period, or half period, or frequency of the ring may then be determined, as indicated at reference numeral 90 in FIG. 8. Finally, where desired, the waveform may be converted by a one-dimensional fast Fourier transform to a frequency response relationship as indicated in FIG. 9. This frequency response may be represented graphically along an amplitude axis 98 and a frequency axis 100. The frequency trace 102 in FIG. 9 indicates a resonant frequency at peak 104 which generally corresponds to the wavelength measured for the resonant ring as discussed above. As noted, either the frequency or the period of the waveform may be used for the calculation of the impedance parameters.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for determining power line impedance comprising:
   measuring a first voltage of an ac waveform applied to an electrical line;
   draining current from the line and measuring a second voltage of the ac waveform during a droop in voltage resulting from the current drain;
   removing the current drain to cause a resonant ring in the voltage in the line;
   measuring a parameter of the resonant ring; and
   computing the line impedance based upon the measured first and second voltages and the measured parameter of the resonant ring.

2. The method of claim 1, the step of draining current includes closing a solid state switch to place a resistor between the line and a different electrical potential.

3. The method of claim 1, comprising placing a capacitor between the line and a different electrical potential, wherein the period or frequency of the resonant ring is a function of a capacitance of the capacitor and an inductive component of the line impedance.

4. The method of claim 1, comprising computing inductive and resistive components of the line impedance.

5. The method of claim 1, comprising periodically sampling voltage during the measuring steps and storing values representative thereof.

6. The method of claim 5, wherein measuring the voltages includes measuring peak voltages based upon the stored sampled voltage values.

7. The method of claim 1, wherein the parameter of the resonant ring is a period or a frequency of the resonant ring.

8. The method of claim 1, wherein the electrical line carries single phase power.

9. The method of claim 1, wherein the first and second voltages are peak voltages during successive cycles of the ac waveform.

10. The method of claim 1, wherein the parameter of the resonant ring is a frequency.

11. A method for determining power line impedance comprising:
   measuring a first voltage of an ac waveform applied to an electrical line;
   closing a solid state switch to place a resistor between the line and a different electrical potential;
   measuring a second voltage of the ac waveform during a droop in voltage resulting from current drain through the resistor;
   opening the solid state switch to cause a resonant ring in the voltage in the line based on an inductive component of the line impedance;
   measuring a parameter of the resonant ring; and
   computing inductive and resistive components the line impedance based upon the measured first and second voltages and the measured parameter of the resonant ring.

12. The method of claim 11, wherein the resonant ring has a frequency that is s function of the inductive component of the line impedance and a capacitor coupled downstream of the resistor, and wherein the ring is damped by the resistor.

13. The method of claim 11, wherein the first and second voltages are peak voltages during successive cycles of the ac waveform.

14. The method of claim 11, wherein the parameter of the resonant ring is a frequency.

15. The method of claim 11, wherein the parameter of the resonant ring is a period.

16. The method of claim 11, the inductive component of the power line impedance is determined based upon a capacitance value of the capacitor, a resistance value of the resistor, and a frequency or a period of the resonant ring.

17. The method of claim 16, wherein the inductive component of the power line impedance is determined based upon the relationship:

$$L = \frac{\frac{1}{Cload} + \sqrt{\frac{1}{Cload^2} - (2\pi f)^2 Rload^2}}{2(2\pi f)^2}$$

where L is the inductive component of the power line impedance, Cload is the capacitance value of the capacitor, Rload is the resistance value of the resistor, and f is the frequency of the resonant ring.

18. The method of claim 11, wherein the resistive component of the power line impedance is determined based upon voltage measurements with and without the resistor in short circuit between two power line conductors, the inductive component of the power line impedance, and the resistance value of the resistor.

19. The method of claim 18, wherein the resistive component of the power line impedance is determined based upon the relationship:

$$R = \sqrt{\frac{(VoRload)^2 - (Vr377L)^2}{Vr^2}} - Rload$$

where R is the resistive component of the power line impedance, Vo is a voltage measurement without the resistor in short circuit between the power line conductors, Vr is a voltage measurement with the resistor in short circuit between the power line conductors, L is the inductive component of the power line impedance, and Rload is the resistance value of the resistor.

20. A method for determining power line impedance comprising:
sampling power line voltage with and without a burden resistor in short circuit with the power line;
causing a resonant LC ring in the power line voltage and sampling power line voltage during the ring;
identifying a parameter of the LC ring; and
computing inductive and resistive components the line impedance based upon the measured voltages and the parameter of the LC ring.

21. The method of claim 20, wherein the voltages used to compute the inductive and resistive components of the line impedance are peak voltages of an ac waveform with and without the burden resistor in short circuit with the power line.

22. The method of claim 20, wherein the LC ring results from a capacitor in series with the burden resistor and the inductive component of the line impedance.

23. The method of claim 20, wherein the parameter of the LC ring is a frequency.

24. The method of claim 20, wherein the parameter of the LC ring is a period.

25. A system for determining power line impedance comprising:
a resistor configured to be coupled between power line conductors;
a capacitor in series with the resistor;
a switch for placing the resistor a short circuit between the power line conductors and for interrupting the short circuit to cause a resonant ring between the capacitor and an inductive component of the power line impedance;
measurement circuitry for measuring voltages during a test sequence in which the switch is switched on and off, and
processing circuitry for determining inductive and capacitive components of power line impedance based upon the measured voltages.

26. The system of claim 25, wherein the processing circuitry determines the inductive component of the power line impedance based upon a capacitance value of the capacitor, a resistance value of the resistor, and a frequency or a period of the resonant ring.

27. The system of claim 26, wherein the processing circuitry determines the inductive component of the power line impedance based upon the relationship:

$$L = \frac{\frac{1}{Cload} + \sqrt{\frac{1}{Cload^2} - (2\pi f)^2 Rload^2}}{2(2\pi f)^2}$$

where L is the inductive component of the power line impedance, Cload is the capacitance value of the capacitor, Rload is the resistance value of the resistor, and f is the frequency of the resonant ring.

28. The system of claim 25, wherein the processing circuitry determines the resistive component of the power line impedance based upon voltage measurements with and without the resistor in short circuit between the power line conductors, the inductive component of the power line impedance, and the resistance value of the resistor.

29. The system of claim 28, wherein the processing circuitry determines the resistive component of the power line impedance based upon the relationship:

$$R = \sqrt{\frac{(VoRload)^2 - (Vr377L)^2}{Vr^2}} - Rload$$

where R is the resistive component of the power line impedance, Vo is a voltage measurement without the resistor in short circuit between the power line conductors, Vr is a voltage measurement with the resistor in short circuit between the power line conductors, L is the inductive component of the power line impedance, and Rload is the resistance value of the resistor.

30. A system for determining power line impedance comprising:
voltage measurement circuitry for measuring voltage valued in the power line;
test circuitry including a solid state switch in series with a burden resistor and in parallel with a capacitor, the switch being switchable to place the resistor in a short circuit between the power line and a different potential and to cause a resonant ring between the capacitor and an inductive component of the power line impedance;
drive circuitry for switching the solid state switch; and
processing circuitry for determining inductive and resistive components of the power line impedance from voltage measurements made by the voltage measurement circuitry with and without the resistor in the short circuit and during the resonant ring.

31. The system of claim 30, further comprising an enable switch in series with the solid state switch for establishing a current carrying path between line conductors.

32. The system of claim 30, wherein the voltage measurement circuitry is configured to sample voltage at predetermined time intervals, and the processing circuitry is configured to identify voltage parameters for computation of the inductive and resistive components of the power line impedance from stored sampled voltage values.

33. The system of claim 30, wherein the test circuitry is configured to be coupled between conductors carrying single phase ac power.

34. A system for determining power line impedance comprising:
   means for measuring a first voltage of an ac waveform applied to an electrical line;
   means for draining current from the line and measuring a second voltage of the ac waveform during a droop in voltage resulting from the current drain;
   means for removing the current drain to cause a resonant ring in the voltage in the line;
   means for measuring a parameter of the resonant ring; and
   means for computing the line impedance based upon the measured first and second voltages and the measured parameter of the resonant ring.

* * * * *